United States Patent [19]

Kwon et al.

[11] Patent Number: 5,073,510
[45] Date of Patent: Dec. 17, 1991

[54] FABRICATION METHOD OF CONTACT WINDOW IN SEMICONDUCTOR DEVICE

[75] Inventors: Oh-Hyun Kwon; Taek-Yong Jang; Jung-Hyun Shin; Won-Taek Choi, all of Seoul, Rep. of Korea

[73] Assignee: Samsung Electronics Co., Ltd., Suweon, Rep. of Korea

[21] Appl. No.: 602,464

[22] Filed: Oct. 23, 1990

[30] Foreign Application Priority Data

Jul. 30, 1990 [KR] Rep. of Korea ............... 90-11615

[51] Int. Cl.⁵ ........................... H01L 21/265
[52] U.S. Cl. ........................ 437/40; 437/44; 437/978; 437/979; 148/DIG. 43
[58] Field of Search ........... 437/978, 979, 984, 40, 437/41, 44, 147; 148/DIG. 43, DIG. 163

[56] References Cited

U.S. PATENT DOCUMENTS

| | | | |
|---|---|---|---|
| 4,080,719 | 3/1978 | Wilting | 437/147 |
| 4,503,601 | 3/1985 | Chiao | 437/979 |
| 4,810,666 | 3/1989 | Taji | 437/44 |

Primary Examiner—Brian E. Hearn
Assistant Examiner—C. Chaudhari
Attorney, Agent, or Firm—Ladas & Parry

[57] ABSTRACT

According to the present invention, the incomplete silicon exposure is prevented by the sufficient overetching after the formation of an etching-stop layer on an oxide layer for protecting a conductive layer from the damage of the protective oxide layer when the self-aligned contact window is formed. Therefore, the thickness of the protective oxide layer can be minimized, and the bend of the chip can be improved whereby the following process will be accomplished easily.

13 Claims, 4 Drawing Sheets

FABRICATION METHOD OF CONTACT WINDOW IN SEMICONDUCTOR DEVICE

BACKGROUND OF THE INVENTION

The present invention relates to a fabrication method of contact windows in semiconductor devices which can efficiently prevent an incomplete silicon exposure of the contact window by sufficient overetching insulators in the contact window formation process.

Recently, as the semiconductor devices have a tendency toward high integration, each device is minimized and the misalignment margin of a photomask is also reduced in a photolithography process. In order to expose fine contact windows, therefore, a self-alignment method is employed in such a manner that a contact window is exposed by using peripheral patterns as an etching mask after forming a larger contact pattern than a necessary contact window. Particularly, a self-alignment method is essential in VLSI memory devices having a design rule below 0.6 μm, a contact size below 0.5 μm, and a misalignment margin below 0.3 μm.

FIG. 1(A) and 1(B) are schematic cross-sectional views each illustrating a conventional fabrication method of contact windows. In FIG. 1(A), a P-type well region 2 is first formed on a P-type substrate 1 and then a switching transistor region is defined by selectively forming a thick field oxide layer 3 on the surface of the P-type well region 2. A P+-type channel stopper 5 to prevent any interaction between two adjacent transistors is formed under the field oxide layer 3 by ion-implantation.

Subsequently, a gate oxide layer 7 is thermally grown on the surface of the P-type well region 2 and polysilicon layers 9 and 10 are sequentially deposited on predetermined positions of the field oxide layer 3 and the gate oxide layer 7 to serve as gate electrodes. The polysilicon layer 9 on a transistor region and the polysilicon layer 10 on the field oxide layer 3 are formed simultaneously.

During this process, a protective oxide layer 11 is left on tops of the polysilicon layers 9 and 10. And then, an oxide layer is deposited over the entire surface and spacers 13 are formed at the side walls of the polysilicon layers 9 and 10 by the a reactive ion etching(RIE) method.

A n-type impurity (phosphorous or arsenic) is implanted into the silicon surfaces 9 and 10 by using the spacer 13 as a impurity blocking layer. Subsequent heat cycles make the impurity diffuse deeper into the P-well region 2 to form a source 15 and a drain 16 of the transistor. Hereinabove, a NMOS transistor is formed on the P-type well, but it can be also formed on a P-type substrate.

Now, referring to FIG. 1(B), after an oxide layer 17 deposited over the entire surface is patterned and etched to expose the diffusion region 15 by the conventional photolithography process. When the diffusion region 15 is exposed, the opening size is larger than the exposed diffusion region 15 and a contact window does not locate completely inside the diffusion region so that the misalignment margin is increased for a self-alignment. The surface of the exposed diffusion region is used as an electrically available region. To guarantee the exposure of the silicon substrate, the oxide layer 17 must be sufficiently overetched since the oxide layer 17 on the polysilicon layers 9 and 10 is also etched away during this etching process.

The protective oxide layer 11 must be made thick enough to maintain sufficient oxide layer thickness after the oxide layer etching process so as to prevent the exposure of the polysilicon layers 9 and 10. Thus, the protective oxide layer 11 must be made thicker than the oxide layer 17. However, the increase of the thickness of the protective oxide layer 11 causes a bad surface topography in a submicron divice level.

In the conventional method of manufacturing the semiconductor devices as described heretofore, the incomplete silicon exposure is prevented by the sufficient overetching after the deposition of the protective oxide layer when a self-aligned contact window is made. But, when the overetching is carried out the exposure of the contact window, the protective oxide layer is also etched away resulting in the exposure of the conductive layer. Furthermore, if the protective oxide layer is deposited excessively thick, the surface topography becomes bad to result in lots of processing difficulties in subsequent steps.

SUMMARY OF THE INVENTION

The present invention has an object to provide a fabrication method of contact windows in semiconductor devices, in which the exposure of the contact windows can be accomplished sufficiently and also the thickness of the protective oxide layer can be minimized.

Another object of the present invention is to provide a method for manufacturing a semiconductor device, in which the bend of a chip can be improved by using the contact window formation method according to the present invention.

According to the present invention, there is provided a fabrication method of contact windows in semiconductor devices, comprising the steps of: (a) defining a switching transistor region on a semiconductor substrate by forming a field oxide layer at a predetermined portion; (b) forming a gate oxide layer, a polysilicon layer, a protective oxide layer, and an etching-stop layer sequentially on said transistor region and said field oxide layer; (c) forming spacers at both side walls of said polysilicon layer; (d) forming a conductive diffusion region differently from that of said semiconductor substrate in the switching transistor region; (e) depositing an oxide layer over the entire surface; and (f) etching said oxide layer on said diffusion region from a predetermined portion according to a self-alignment method.

Furthermore, according to the present invention, there is provided a method of manufacturing semiconductor devices, comprising the steps of: (a) defining a switching transistor region on a semiconductor substrate by forming a field oxide layer at a predetermined portion; (b) forming a gate oxide layer, a first polysilicon layer, and a first etching-stop layer sequentially on said transistor region and said field oxide layer; (c) forming first spacers at side walls of said first polysilicon layer; (d) forming first and second conductive diffusion regions in said transistor region differently from that of the semiconductor substrate; (e) forming a first oxide interlayer on the entire surface; (f) forming a first contact window by removing said first oxide interlayer on said first diffusion region from a predetermined portion according to a self-alignment method; (g) forming a second polysilicon layer, a second protective oxide layer and a second etching-stop layer sequentially on said first diffusion layer; (h) forming a second polysilicon layer, a second protective oxide layer, and a second etching-stop layer on said first contact window; (i) forming second spacers at side walls of said second polysilicon layer; (j) forming a second contact window by removing said first and second oxide layers on said second diffusion region from a predetermined portion according to the self-alignment method; and (k) forming a third polysilicon layer, an insulating layer and a fourth polysilicon layer sequentially on said second contact window.

BRIEF DESCRIPTION OF DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to the accompanying drawings.

Figure 1A:
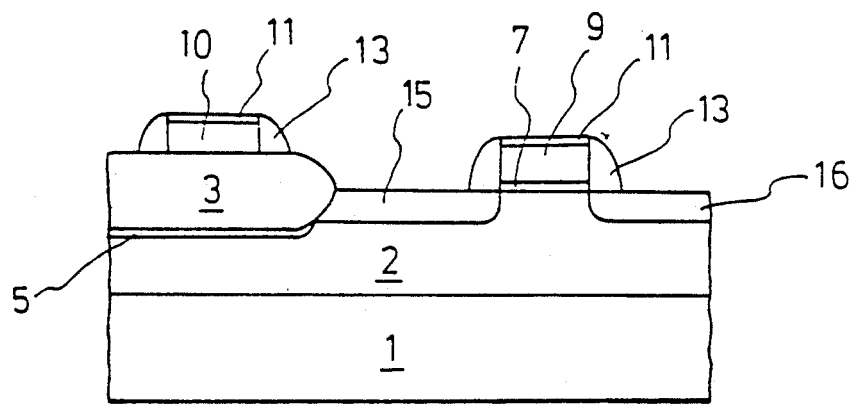
FIG. 1(A)-(B) are schematic cross-sectional views each illustrating the steps for forming contact windows according to the conventional method.
Figure 1B:
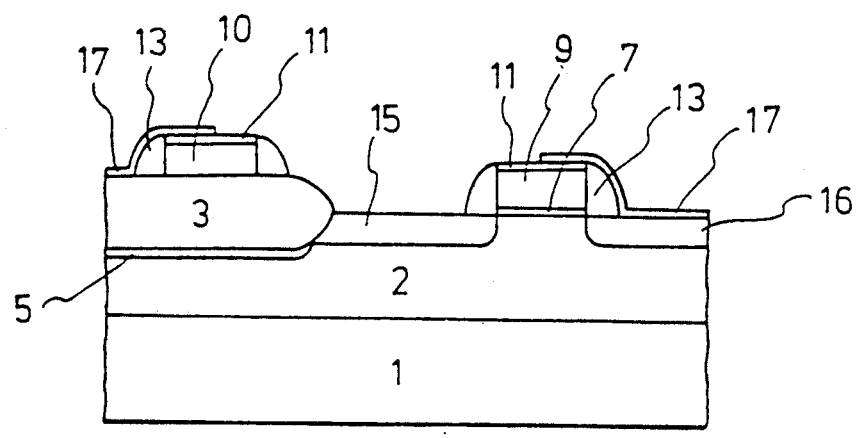
Figure 2A:
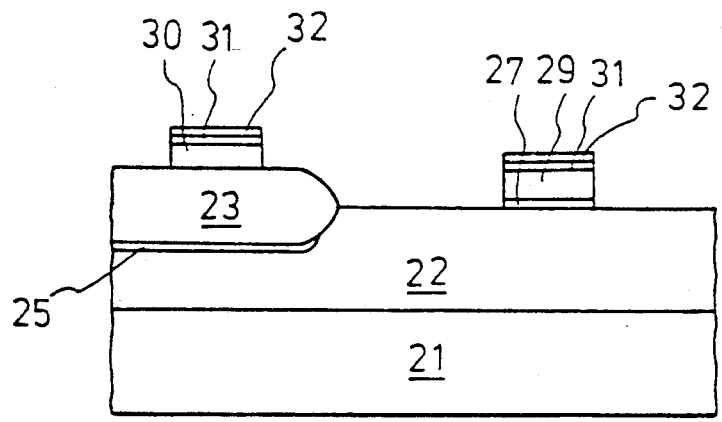
FIG. 2(A)-(C) are schematic cross-sectional views each illustrating the steps of the method for forming contact windows according to the present invention.
Figure 2B:
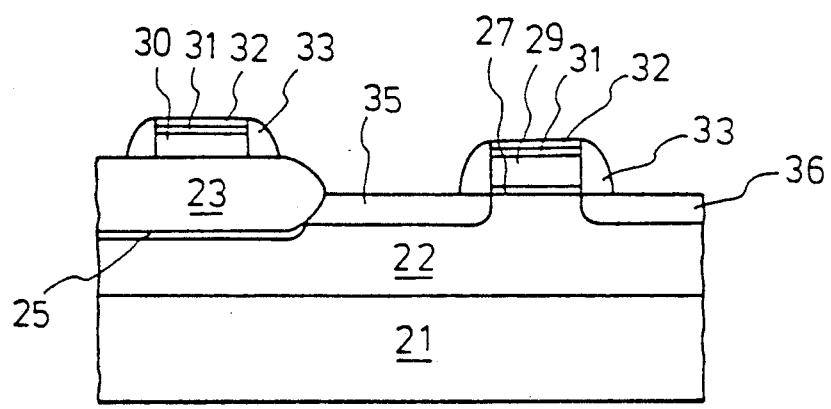
Figure 2C:
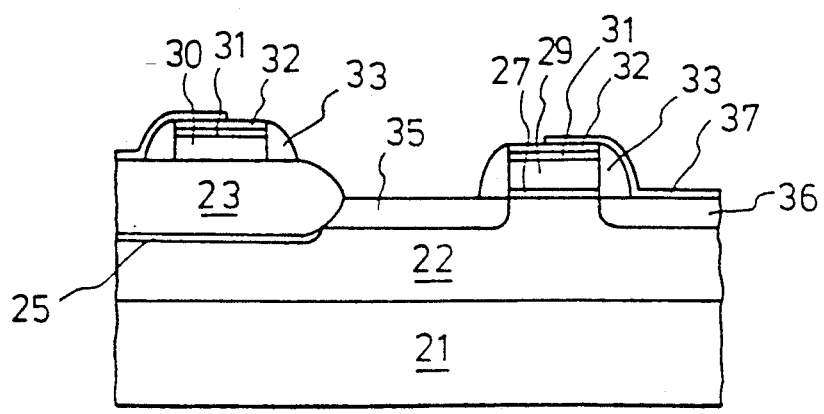

FIG. 2(A)-2(C) are schematic cross-sectional views each illustrating the steps for forming contact windows according to the present invention. After a P-type well region 22 is deposited on the surface of a P-type substrate 21, a thick field oxide layer 23 is deposited on the surface of the P-type well region 22 by a local oxidation of silicon method (LOCOS) to define a switching transistor region. And a P+-type channel stopper 25 is formed by ion-implantation under the field oxide layer 23 to prevent the interaction between two adjacent transistors.

Subsequently, an oxide layer, a polysilicon layer, and a nitride layer are sequentially deposited on the entire surface of the P-type well region 22, and then an etching-stop layer 32, a protective oxide layer 31, polysilicon layers 29 and 30, and a gate oxide layer 27 are sequentially formed by the conventional photolithography process. The polysilicon layers are used as gate electrodes of the transistor. The etching-stop layer 32 may be made of Silicon Nitride or Titanium Nitride, and this layer has a larger selective ratio of etching than the oxide layer. Also, the etching-stop layer 32 may be made of Aluminum Oxide which is an isolating material with a larger selective ratio of etching than the oxide layer.

Now, referring to FIG. 2(B), after a high temperature oxide (HTO) layer is thickly deposited on the entire surface as shown in FIG. 2(A), spacers 33 are formed at both side walls of the polysilicon layers 29 and 30 by the RIE method. Next, a n-type impurity (phosphorous or arsenic) is implanted into the silicon surface by using the spacers 33 as the impurity blocking layers. First and second diffusion regions 35 and 36 are formed as a source and a drain of the transistor by the diffusion of the implanted impurity into the P-type well region 22. It is to be noted that an NMOS transistor described heretofore is formed on the P-type well, but it also may be formed on a P-type substrate.

Now, referring to FIG. 2(C), after an oxide layer 37 deposited over the entire surface is patterned and etched to expose the first diffusion region 35 by the photolithography process. The exposed surface of the first diffusion region 35 is used as a contact window. In this process, when the first diffusion region 35 is exposed, the opening size of the oxide layer 37 is larger than the first diffusion region 35 which is exposed so that the misalignment margin is increased and the self-alignment can be simply achieved. Furthermore, the incomplete silicon exposure of the first diffusion region 35 is prevented by overetching the oxide layer 37 sufficiently. During the overetching of the oxide layer 37 on the first diffusion region 35, the etching-stop layer 32 prevents the protective oxide layer 31 from etching. Thus, the thickness of this protective oxide layer 31 can be minimized.

Figure 3A:
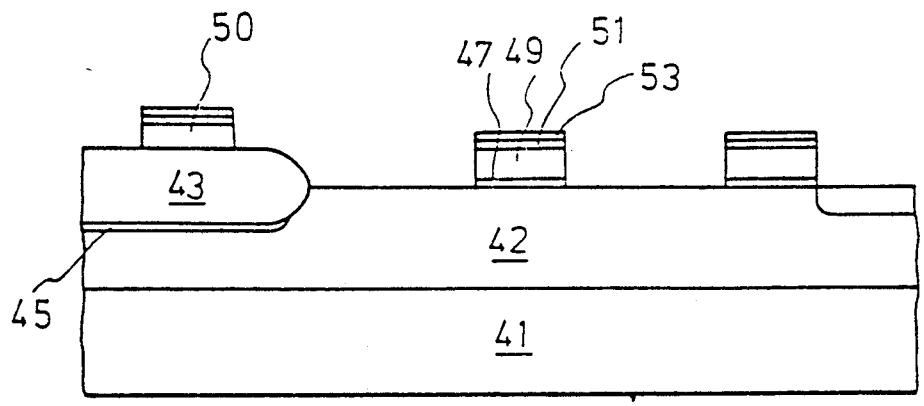
FIG. 3(A)-(F) are schematic cross-sectional views each illustrating the steps for manufacturing method of semiconductor devices according to the present invention.

FIG. 3(A)-(F) are schematic cross-sectional views each illustrating the steps of manufacturing semiconductor devices according to the present invention. In FIG. 3(A), a P-type well region 42 having the doping concentration of about 10 ions/cm$^3$ and the depth of 4 $\mu$m is formed on a P-type substrate having the resistivity of 18$\Omega$-cm and orientation of <100>. A switching transistor region is substantially formed on the P-type well region 42 by forming a field oxide layer 43 at a predetermined portion by the LOCOS method. A P+-type channel stopper 45 to prevent the interaction between two adjacent transistors is formed under the field oxide layer 43 by ion-implantation. Subsequently, an oxide layer of 100-200 Å, a polysilicon layer of 1000-3000Å, and a nitride layer of 200-500Å are sequentially deposited on the surface of the P-type well region 42, where the nitride layer is made of Silicon Nitride or Titanium Nitride. And then, first polysilicon layers 49 and 50 to be used as gate electrodes are formed by the conventional photolithography process. A gate oxide layer 47 is formed under the polysilicon layers 49 and 50, while a first protective oxide layer 51 and a first etching-stop layer 53 are sequentially left on the polysilicon layers 49 and 50. Also, the first etching-stop layer 53 can be formed of Aluminum Oxide besides Silicon Nitride or Titanium Nitride which has a larger selective ratio of etching than the oxide layer. The first polysilicon layer 50 formed on the field oxide layer 43 is used as a gate electrode of another transistor.

Figure 3B:
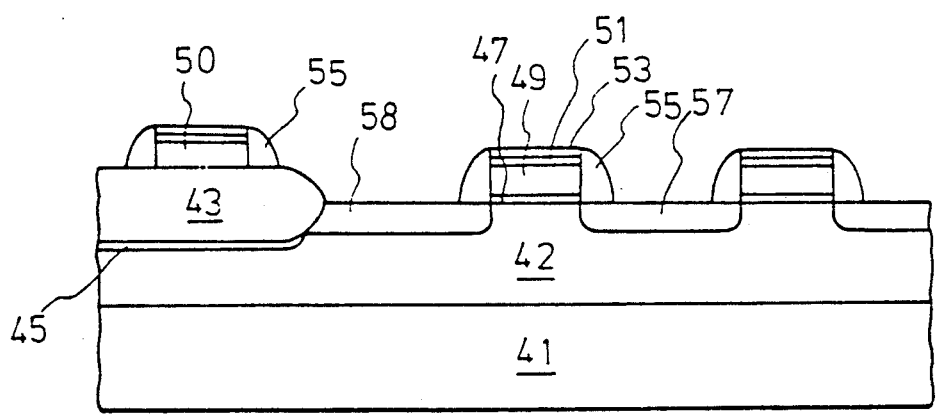

Now, referring to FIG. 3(B), after a HTO layer is thickly deposited on the entire surface, each first spacer 55 is respectively formed at each side wall of the polysilicon layers 49 and 50 by removing the HTO layer by the RIE method. An n-type impurity (phosphorous or arsenic) is implanted into the silicon layers by using the first spacers 55 as an impurity blocking layer. Subsequent heat cycles make the impurity diffuse deeper into the P-type well region 42 to form first and second diffusion regions 57 and 58 as a source and a drain of the transistor.

Figure 3C:
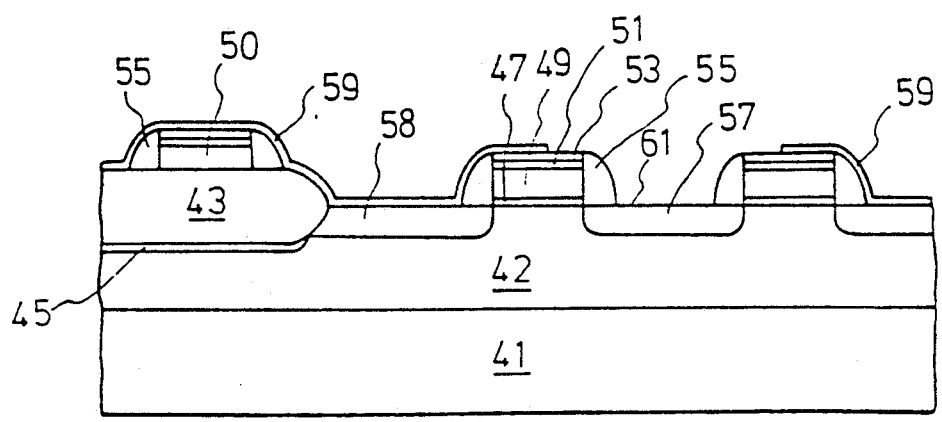

Now, referring to FIG. 3(C), a first oxide interlayer 59 of 300-1000Å deposited over the entire surface is patterned and etched to expose the first diffusion region 57 by the photolithography process. The exposed surface of the first diffusion region 57 is served as a first contact window 61. When the first diffusion region 57 is exposed, the opening size is larger than the first diffusion region 57 which is exposed, so that the misalignment margin is increased for the self-alignment. At this time, the incomplete exposure of the first diffusion region 57 is prevented by overetching the first oxide interlayer 59 sufficiently. The first etching-stop layer 53 prevents the first protective oxide layer 51 from etching, so that the thickness of the first protective oxide layer 51 is minimized.

Figure 3D:
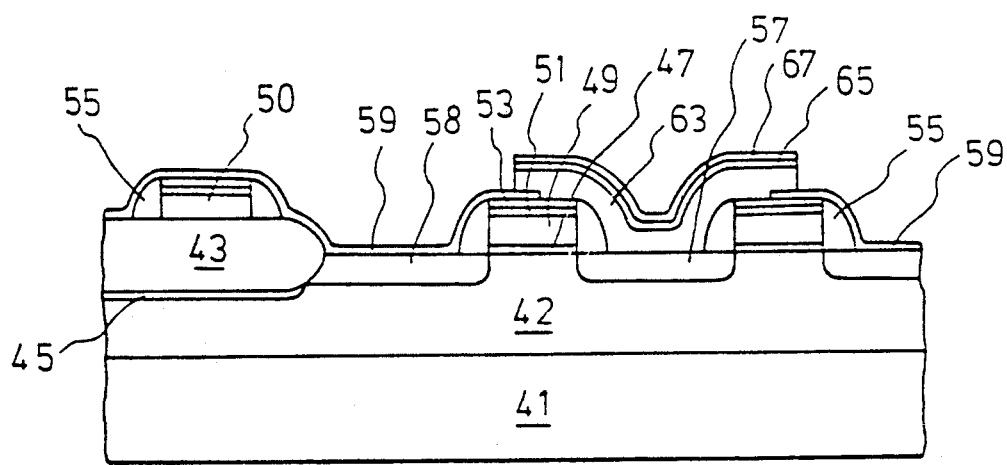

Now, referring to FIG. 3(D), a polysilicon layer of 1000-3000Å, an oxide layer of 300-1000Å, and a nitride layer of 200-500Å are sequentially deposited on the entire surface. The nitride layer is made of Silicon Nitride or Titanium. Subsequently, a second etching-stop layer 67, a second protective oxide layer 65, and a second polysilicon layer 63 are sequentially formed on the first diffusion region 57 by the conventional photolithography process. The second polysilicon layer 63 is electrically connected to the first diffusion region 57 through the contact window 61, being used as the bit-line. Also, the second etching-stop layer 67 may be made of Aluminum Oxide, similarly to the first etching-stop layer 53.

Figure 3E:
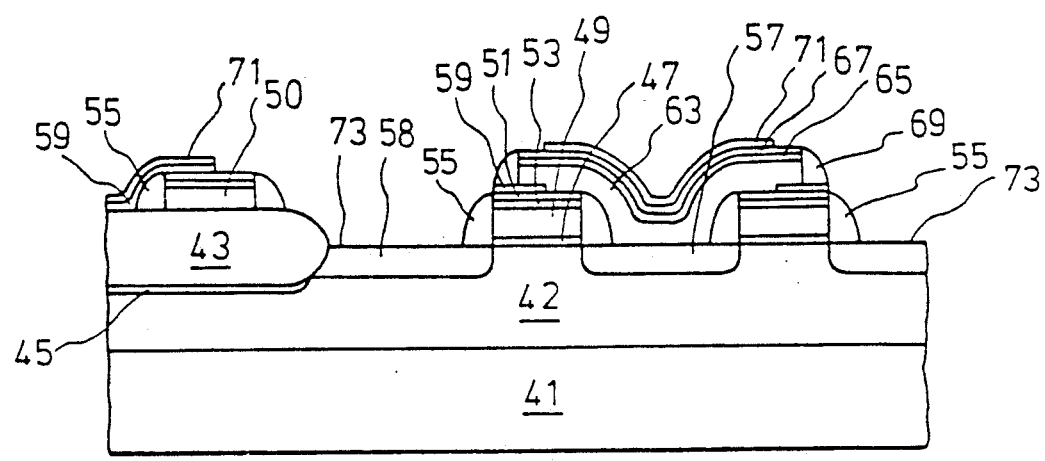

Now, referring to FIG. 3(E), second spacers 69 are formed at the side walls of the second polysilicon layer 63 in the same manner with those of the first spacers 55. After a second oxide interlayer 71 of 300-1000Å deposited on the entire surface, the second diffusion region 58 is exposed. Similarly, a second etching-stop layer 67 prevents the second protective oxide layer 65 from etching. The exposed surface of the second diffusion region 58 is used as a second contact window 73.

Figure 3F:
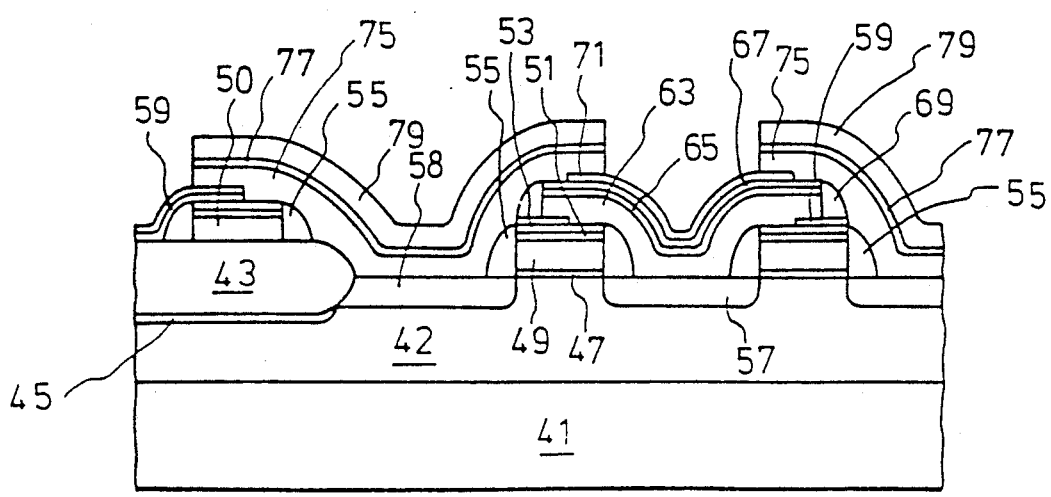

Now, referring to FIG. 3(F), after a polysilicon layer of 2000-3000Å, an oxide layer of 100-200Å, and a nitride layer of 2000-3000Å are sequentially deposited on the entire surface so that a third polysilicon layer 75, an isolating layer 77, and a fourth polysilicon layer 79 are sequentially formed by the conventional photolithography process. The third polysilicon layer 75 which is used as the storage electrode of a capacitor is electrically connected to the second diffusion region 58 through the second contact window 73. The fourth polysilicon layer 79 is used as the plate electrode of the capacitor. The isolating layer 77 is made of Oxide or Oxide-Nitride-Oxide(ONO) layer and used to form the capacitor. Also, the second, third, and fourth polysilicon layers can be replaced by Tungsten or Titanium Silicide layer.

Heretofore, although the contact window formation method according to the present invention is described in manufacturing a stacked-memory device, but it can be also applied for all memory devices such as a trench structure and so on.

The present invention can prevent the incomplete silicon exposure by the sufficient overetching utilizing the etching-stop layer when the self-aligned contact window is exposed. Moreover, since the damage of the protective oxide layer is prevented due to the etching-stop layer during the overetching, the protective oxide layer can be minimized, thereby the bend of the chip can be improved and following process can be performed easily.

The invention is in no way limited to the embodiment described hereinabove. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A fabrication method of contact windows in semiconductor devices, comprising the steps of:
    (a) defining a switching transistor region on a semiconductor substrate by forming a field oxide layer at a predetermined portion;
    (b) forming a gate oxide layer, a polysilicon layer, a protective oxide layer, and an etching-stop layer sequentially on said transistor region and said field oxide layer;
    (c) forming spacers at side walls of said polysilicon layer;
    (d) forming a conductive diffusion region of a conductivity type different from that of said semiconductor substrate in the switching transistor region;
    (e) thereafter depositing an oxide layer over the entire surface including said diffusion region and said etching-stop layer; and
    (f) etching said oxide layer on said diffusion region to provide a window through said oxide layer overlying said diffusion region while said etching-stop layer is in place.

2. A method according to claim 1, wherein said etching-stop layer is formed of an isolating material which has a larger selective ratio of etching than said protective oxide layer.

3. A method according to claim 2, wherein said isolating layer is formed of one of Silicon Nitride, Titanium Nitride and Aluminum Oxide.

4. A method according to claim 1, wherein said oxide layer on said diffusion region is completely removed by overetching.

5. A method according to claim 4, wherein said etching-stop layer prevents the damage of said protective oxide layer during the overetching.

6. A method of manufacturing semiconductor devices, comprising the steps of:
    (a) defining a switching transistor region on a semiconductor substrate by forming a field oxide layer at a predetermined portion;
    (b) forming a gate oxide layer, a first polysilicon layer, a first protective oxide layer, and a first etching-stop layer sequentially on said transistor region and said field oxide layer;
    (c) forming first spacers at side walls of said first polysilicon layer;
    (d) forming first and second conductive diffusion regions in said transistor region differently from that of the semiconductor substrate;
    (e) forming a first oxide interlayer on the entire surface;
    (f) forming a first contact window by removing said first oxide interlayer on said first diffusion region from a predetermined portion according to a self-alignment method;
    (g) forming a second polysilicon layer, a second protective oxide layer and a second etching-stop layer sequentially on said first diffusion layer;
    (h) forming a second polysilicon layer, a second protective oxide layer, and a second etching-stop layer sequentially on said first contact window;
    (i) forming second spacers at side walls of said second polysilicon layer;
    (j) forming a second contact window by removing said first and second oxide layers on said second diffusion region from a predetermined portion using the self-alignment method; and (k) forming a third polysilicon layer, an isolating layer and a fourth polysilicon layer sequentially on said second contact window.

7. A method according to claim 6, wherein the thickness of said first and second protective oxide layers is in the range of 300–1000Å.

8. A method according to claim 6, wherein said first and second etching-stop layers are formed of an isolating material which has a larger selective ratio of etching than the oxide layer.

9. A method according to claim 8, wherein said isolating layer is formed of one of Silicon Nitride, Titanium Nitride, and Aluminum Oxide.

10. A method according to claim 9, wherein the thickness of said isolating layer is in the range of 200–500Å.

11. A method according to claim 6, wherein said first and second contact windows are formed by overetching the oxide layer.

12. A method according to claim 11, wherein said first and second etching-stop layers prevent the damage of said first and second protective oxide layers during the overetching.

13. A method according to claim 1 including, after step (f), forming a conductive contact on said diffusion region through the oxide layer etched in step (f).

* * * * *